United States Patent
Hsu et al.

(10) Patent No.: US 9,520,349 B2
(45) Date of Patent: Dec. 13, 2016

(54) SEMICONDUCTOR PACKAGE

(71) Applicant: MediaTek Inc., Hsin-Chu (TW)

(72) Inventors: Wen-Sung Hsu, Zhubei (TW); Tzu-Hung Lin, Zhubei (TW); Ta-Jen Yu, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/611,354

(22) Filed: Feb. 2, 2015

(65) Prior Publication Data

US 2015/0145127 A1    May 28, 2015

Related U.S. Application Data

(63) Continuation of application No. 13/825,701, filed on Mar. 15, 2013.
(Continued)

(51) Int. Cl.
*H01L 23/00* (2006.01)
*H01L 23/31* (2006.01)
*H01L 23/498* (2006.01)

(52) U.S. Cl.
CPC ..... *H01L 23/49811* (2013.01); *H01L 23/3142* (2013.01); *H01L 23/3171* (2013.01);
(Continued)

(58) Field of Classification Search
CPC .. H01L 23/49811; H01L 23/498; H01L 24/10; H01L 24/12; H01L 24/13; H01L 24/14; H01L 24/15; H01L 24/16; H01L 24/17; H01L 2224/1301; H01L 2224/13007
See application file for complete search history.

(56) References Cited

U.S. PATENT DOCUMENTS 5,334,804 A * 8/1994 Love ............... H01L 21/486
174/257
6,111,205 A    8/2000 Leddige et al.
(Continued)

FOREIGN PATENT DOCUMENTS

| CN | 1497718 A | 5/2004 |
|---|---|---|
| CN | 102376668 A | 3/2012 |
| EP | 2120262 A1 | 11/2009 |

OTHER PUBLICATIONS

"Chip Orientation Aid"; Sep. 1978; IMB Technical Disclosure Bulletin; vol. 21; Issue 4; pp. 1461-1462.

*Primary Examiner* — Peniel M Gumedzoe
(74) *Attorney, Agent, or Firm* — McClure, Qualey & Rodack, LLP

(57) ABSTRACT

A semiconductor package is provided. In one configuration, the semiconductor package includes a substrate. A conductive trace is disposed on the substrate. A conductive pillar bump is disposed on the conductive trace, wherein the conductive bump is coupled to a die. In another configuration, a first conductive trace is disposed on the substrate, and a second conductive trace is disposed on the substrate. In the second configuration, a conductive pillar bump disposed on the second conductive trace, connecting to a conductive bump or a metal pad of the semiconductor die. A first conductive structure is disposed between the second conductive trace and the conductive pillar bump or between the second conductive trace and the substrate, and a die is disposed over the first conductive trace.

20 Claims, 21 Drawing Sheets

Related U.S. Application Data

(60) Provisional application No. 61/616,040, filed on Mar. 27, 2012.

(52) U.S. Cl.
CPC ...... *H01L 23/3178* (2013.01); *H01L 23/3192* (2013.01); *H01L 23/49838* (2013.01); *H01L 24/05* (2013.01); *H01L 24/08* (2013.01); *H01L 24/09* (2013.01); *H01L 24/13* (2013.01); *H01L 24/16* (2013.01); *H01L 24/17* (2013.01); *H01L 24/32* (2013.01); *H01L 2224/0401* (2013.01); *H01L 2224/05012* (2013.01); *H01L 2224/05022* (2013.01); *H01L 2224/05124* (2013.01); *H01L 2224/05147* (2013.01); *H01L 2224/05552* (2013.01); *H01L 2224/05572* (2013.01); *H01L 2224/05647* (2013.01); *H01L 2224/05666* (2013.01); *H01L 2224/131* (2013.01); *H01L 2224/13012* (2013.01); *H01L 2224/13015* (2013.01); *H01L 2224/13083* (2013.01); *H01L 2224/13147* (2013.01); *H01L 2224/13155* (2013.01); *H01L 2224/16113* (2013.01); *H01L 2224/16225* (2013.01); *H01L 2224/16227* (2013.01); *H01L 2224/16238* (2013.01); *H01L 2224/26175* (2013.01); *H01L 2224/2919* (2013.01); *H01L 2224/73204* (2013.01); *H01L 2224/81385* (2013.01); *H01L 2924/00014* (2013.01); *H01L 2924/181* (2013.01)

(56) References Cited

U.S. PATENT DOCUMENTS

| | | |
|---|---|---|
| 8,390,119 B2 | 3/2013 | Lin et al. |
| 8,536,458 B1 | 9/2013 | Darveaux et al. |
| 2005/0093176 A1 | 5/2005 | Hung et al. |
| 2006/0091566 A1 | 5/2006 | Yang et al. |
| 2006/0220259 A1* | 10/2006 | Chen ............ H01L 21/563 257/778 |
| 2006/0289972 A1* | 12/2006 | Nishimura ......... H01L 21/563 257/666 |
| 2007/0216027 A1 | 9/2007 | Okamura |
| 2008/0217384 A1 | 9/2008 | Jayantha et al. |
| 2008/0284014 A1 | 11/2008 | Lee et al. |
| 2009/0236756 A1 | 9/2009 | Kim et al. |
| 2009/0243080 A1 | 10/2009 | Pendse et al. |
| 2010/0133688 A1 | 6/2010 | Shigihara et al. |
| 2010/0193944 A1 | 8/2010 | Castro et al. |
| 2010/0289138 A1* | 11/2010 | Masumoto .......... H01L 21/563 257/737 |
| 2012/0007230 A1 | 1/2012 | Hwang et al. |
| 2012/0007232 A1 | 1/2012 | Haba |
| 2012/0025365 A1* | 2/2012 | Haba ............... H01L 21/4853 257/692 |
| 2012/0032322 A1 | 2/2012 | Lin et al. |
| 2012/0100671 A1 | 4/2012 | Kim |

\* cited by examiner

SEMICONDUCTOR PACKAGE

CROSS REFERENCE TO RELATED APPLICATIONS

This application is a continuation of pending U.S. application Ser. No. 13/835,701, filed on Mar. 15, 2013, which claims the benefit of U.S. Provisional Application No. 61/616,040, filed on Mar. 27, 2012, the entireties of which are incorporated by reference herein.

BACKGROUND OF THE INVENTION

Field of the Invention

The present invention relates to a semiconductor package, and in particular, to a high density flip chip package.

Description of the Related Art

In order to ensure miniaturization and multi-functionality of electronic products or communication devices, semiconductor packages are required to be small in size, multi-pin connection, high speed, and high functionality. Increased Input-Output (I/O) pin counts combined with the increased demand for high-performance ICs has led to the development of flip chip packages.

Flip-chip technology uses bumps on chip to interconnect the package media such as a package substrate. The flip-chip is bonded face down to the package substrate through the shortest path. These technologies can be applied not only to single-chip packaging, but also to higher or integrated levels of packaging in which the packages are larger and to more sophisticated substrates that accommodate several chips to form larger functional units. The flip-chip technique, using an area array, has the advantage of achieving a higher density of interconnection to the device and a very low inductance interconnection to the package. However, the increased amount of input/output connections of a multi-functional flip-chip package may induce thermal electrical problems, for example, problems with heat dissipation, cross talk, signal propagation delay, electromagnetic interference for RF circuits, etc. The thermal electrical problems may affect the reliability and quality of products.

Thus, a novel high-density flip chip package is desirable.

BRIEF SUMMARY OF INVENTION

A semiconductor package is provided. An exemplary embodiment of a semiconductor package includes a substrate having a die attach surface. A die is mounted on die attach surface of the substrate via a conductive pillar bump. The die comprises a metal pad electrically coupling to the conductive pillar bump, wherein the metal pad has a first edge and a second edge substantially vertical to the first edge, wherein the length of the first edge is different from that of the second edge from a plan view.

Another exemplary embodiment of a semiconductor package includes a substrate having a die attach surface. A die is mounted on die attach surface of the substrate via a conductive pillar bump. The die comprises a metal pad electrically coupling to the conductive pillar bump, wherein the metal pad has a first length along a first direction and a second length, which is different from the first length, along a second direction from a plan view, wherein the angle between the first direction and the second direction is larger than 0 degrees and less than or equal to 90 degrees.

Yet another exemplary embodiment of a semiconductor package includes a substrate having a die attach surface. A die is mounted on die attach surface of the substrate via a conductive pillar bump. The die comprises a metal pad electrically coupling to the conductive pillar bump, wherein the metal pad has 2-fold rotational symmetry only from a plan view.

Still another exemplary embodiment of a semiconductor package includes a substrate having a die attach surface. A die is mounted on the die attach surface with an active surface of the die facing the substrate, wherein the die is interconnected to the substrate via a plurality of conductive pillar bumps on the active surface, wherein at least one of the plurality of conductive pillar bumps has a bump width that is substantially from equal to or larger than a line width of a trace on the die attach surface of the substrate to two-and-a-half times smaller than the line width of a trace on the die attach surface of the substrate.

Still another exemplary embodiment of a semiconductor package includes a substrate. A conductive trace is disposed on the substrate. A conductive pillar bump is disposed on the conductive trace, wherein the conductive bump is coupled to a die.

Yet another exemplary embodiment of a semiconductor package includes a substrate. A first conductive trace is disposed on the substrate. A solder resistance layer is disposed on the substrate, having an extending portion covering a portion of the first conductive trace, wherein the extending portion of the solder resistance layer has a vertical sidewall extruding over to an adjacent vertical sidewall of the portion of the first conductive trace. A second conductive trace for transmitting signals is disposed on the substrate. A conductive pillar bump is disposed on the second conductive trace, connecting to a conductive bump or a bond pad of the semiconductor die. A first metal pad is disposed between the second conductive trace and the conductive pillar bump or between the second conductive trace and the substrate. A die is disposed over the first conductive trace.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4b is a partial sectional view taken along line I-I' in FIG. 4a.

FIG. 6b shows one possible cross section along line A-A' of FIG. 6a.

FIG. 6c shows another possible cross section along line A-A' of FIG. 6a.

DETAILED DESCRIPTION OF INVENTION

Figure 1:
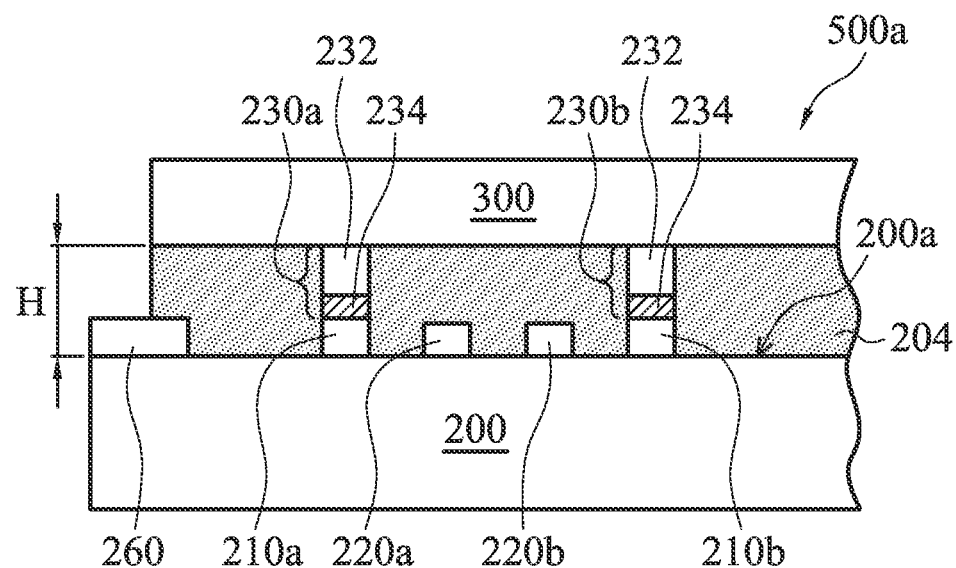
FIG. 1 shows a cross section of one exemplary embodiment of a semiconductor package of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2:
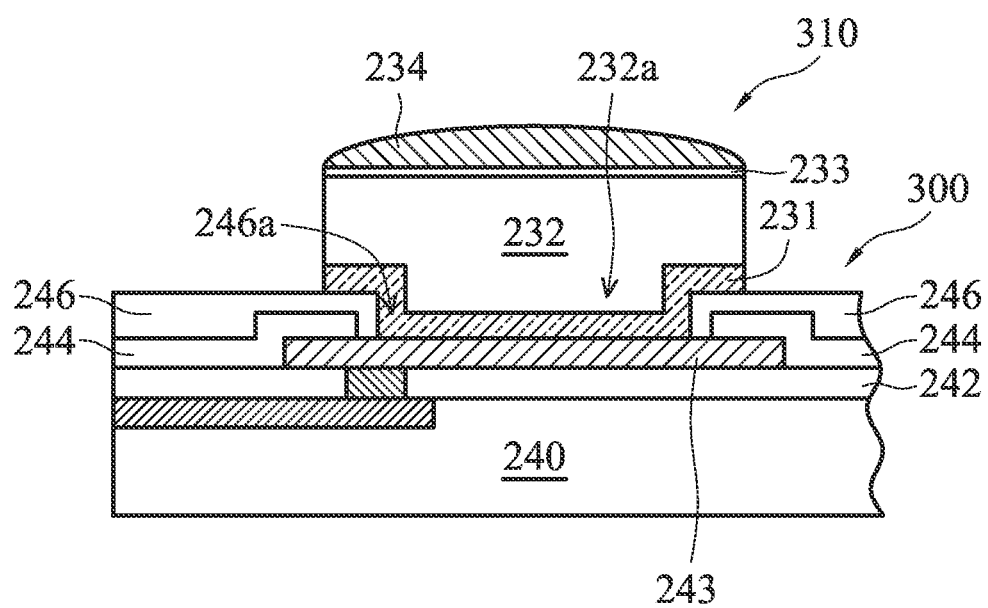
FIG. 2 is a cross section showing the detailed structure of the conductive pillar bump on a die of one exemplary embodiment of a semiconductor package of the invention.

FIG. 1 shows a partial cross section of one exemplary embodiment of a semiconductor package 500a of the invention. FIG. 2 is a cross section showing the detailed structure of the conductive pillar bump on a die of one exemplary embodiment of a semiconductor package 500a of the invention. In this embodiment, the semiconductor package 500a is a flip chip package using conductive pillar bumps, for example, copper pillar bumps, connecting a semiconductor die and a substrate. Please refer to FIG. 1 and FIG. 2, the semiconductor package 500a comprises a substrate 200 having a die attach surface 200a. In one embodiment, the substrate 200 may be formed of by semiconductor materials such as silicon, or organic materials such as bismaleimide triazine, (BT), polyimide or Ajinomoto build-up film (ABF). A plurality of conductive traces 210a, 210b, 220a and 220b are disposed on the die attach surface 200a of the substrate 200. In one embodiment, the conductive traces 210a, 210b, 220a and 220b may comprise signal traces or ground traces, which are used for input/output (I/O) connections of a semiconductor die 210 mounted directly onto the substrate 200.

The die attach surface 200a can be covered with a solder mask 260. In this embodiment, the solder mask 260 can be composed of photosensitive material and can be patterned by photolithographic methods to partially expose the conductive traces 210a, 210b, 220a and 220b and a portion of the die attach surface 200a. For example, the solder mask 260 within a predetermined open area that is directly under the die 300 may be removed to form an open solder mask or open solder resist configuration such that the conductive traces 210a, 210b, 220a and 220b are exposed within the predetermined open area.

A semiconductor die or die 300 is mounted on the die attach surface 200a of the substrate 200 with the active surface of the die 300 facing the substrate 200. The circuitry of the die 300 is interconnected to the circuitry of the substrate 200 via a novel trace bump trace (TBT) interconnection scheme. The TBT interconnection scheme features a plurality of lathy conductive pillar bumps 230a and 230b disposed on the active surface of the die 300. At least one of the conductive pillar bumps 230a and 230b may be composed of a metal stack comprising a UBM (under bump metallurgy) layer such as a sputtered UBM layer (not explicitly shown), a copper layer 232 such as a plated copper layer 232, and a solder cap 234. The detailed structure of conductive pillar bumps 230a and 230b will be discussed later.

Referring to FIG. 1, the conductive pillar bumps 230a and 230b correspond to the conductive traces 210a and 210b on the die attach surface 200a respectively. During the flip chip assembly, the two conductive pillar bumps 230a and 230b, for example, are bonded onto the conductive traces 210a and 210b, respectively. Due to the small size of the conductive pillar bumps 230a and 230b, the stress is reduced, the bump-to-trace space is increased and the problem of bump-to-trace bridging can be effectively avoided. Furthermore, an increased routing space can be obtained. After the reflowing process, an underfill material or underfill 204 can be introduced into the gap between the die 300 and the substrate 200 with an increased stand-off height H. The increased stand-off height H facilitates the underfill process. According to the embodiment, the underfill 204 may be capillary underfill (CUF), molded underfill (MUF) or a combination thereof.

FIG. 2 is a cross section showing the detailed structure of the conductive pillar bump 310 on the one exemplary embodiment of a die 300 of the invention. The sectional view of the conductive pillar bump is taken along the lengthwise direction of the conductive pillar bump. As shown in FIG. 2, the die 300 may include a base 240, a first passivation layer 242 overlying the base 240, a metal pad 243 overlying the first passivation layer 242, a second passivation layer 244 covering the metal pad 243 and the first passivation layer 242, and a stress buffering layer 246 overlying the second passivation layer 244. The term "overlying" can mean, but is not limited to, "on" or "over". In this embodiment, the base 240 may include but is not limited to a semiconductor substrate, circuit elements fabricated on the main surface of the semiconductor substrate, inter-layer dielectric (ILD) layers and interconnection structure. In one embodiment, the interconnection structure may comprise a plurality of metal layers, a plurality of dielectric layers alternatively laminated with the metal layers and a plurality of vias formed through the dielectric layers on the semiconductor substrate. The metal pad 243 belongs to the topmost metal layer of the metal layers of the interconnection structure. Also, the first passivation layer 242 belongs to the topmost dielectric layer of the dielectric layers of the interconnection structure. The first passivation layer 242 may comprise but is not limited to silicon nitride, silicon oxide, silicon oxynitride or any combination thereof. The second passivation layer 244 may comprise but is not limited to silicon nitride, silicon oxide, silicon oxynitride or any combination thereof. The stress buffering layer 246 may comprise but is not limited to polyimide, polybenzoxazole (PBO) or a combination thereof. The metal pad 243 may comprise but is not limited to aluminum, copper or alloys thereof. The stress buffering layer 246 may include the second passivation layer 244.

An opening 246a can be formed in the stress buffering layer 246 to expose at least a portion of the metal pad 243. The opening 246a can be any shape. According to the embodiment, the opening 246 may be a lathy, oval-shaped opening elongating along the lengthwise direction of the conductive pillar bump. A UBM layer 231 can be formed on the exposed metal pad 243 within the opening 246a. The UBM layer 231 may also extend onto a top surface of the stress buffering layer 246. In this embodiment, the UBM layer 231 may be formed by sputtering methods and may comprise titanium, copper or a combination thereof. A copper layer 232 such as an electroplated copper layer can be formed on the UBM layer 231. The opening 326 can be filled with the copper layer 232 and the UBM layer 231, and the copper layer 232 and the UBM layer 231 within the opening 246 may form an integral plug 232a that electrically couples the conductive pillar bump 230 with the underlying metal pad 243. A solder cap 234 can be formed on the copper layer 232. A nickel layer 233 may be formed between the copper layer 232 and the solder cap 234. The copper layer, such as copper layer 232, may be a part of a re-distribution layer (RDL) or may be fabricated concurrently with the RDL.

Figure 3:
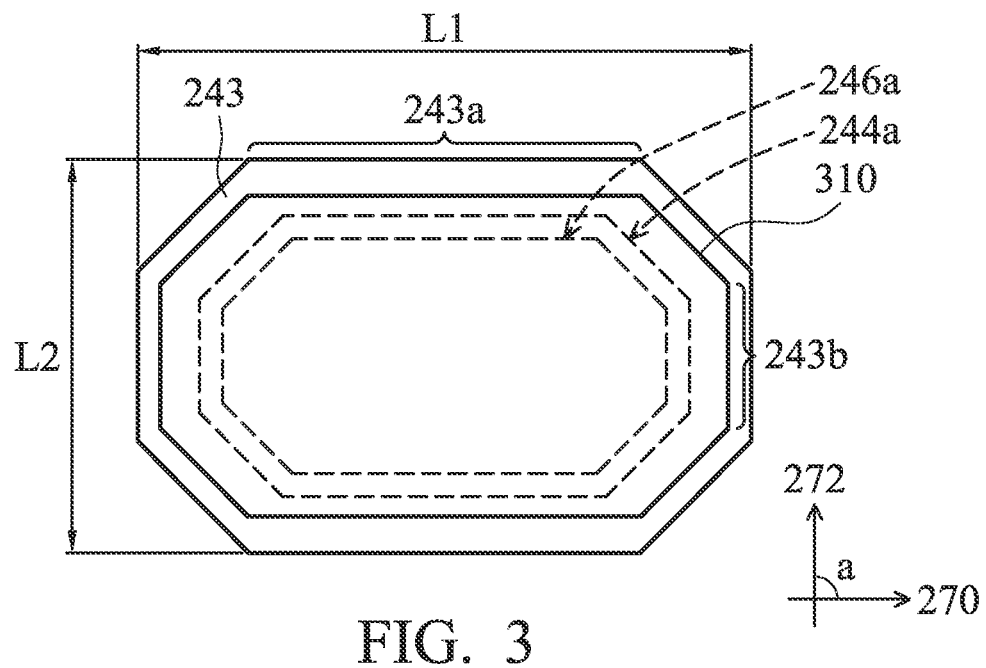
FIG. 3 shows a plane view of a metal pad and the conductive pillar bump of one exemplary embodiment of a semiconductor package of the invention.

FIG. 3 shows a plane view of a metal pad 243 and the conductive pillar bump 310 of one exemplary embodiment of a semiconductor package of the invention. In this embodiment, to improve routing ability for high-density semiconductor packages, a size of the metal pad can be shrunk with a shape similar to the corresponding conductive pillar bump in a plane view. In one embodiment, the metal pad may have 2-fold rotational symmetry only in a plane view, for example, the metal pad may be an octangular shape or oval-shape. In one embodiment as shown in FIG. 3, the metal pad 243 formed on the die attach surface of the substrate may be an octangular shape. The metal pad 243 has a first edge 243a along a first direction 270 and a second edge 243b along a second direction 272, wherein the second edge 243b is substantially vertical to the first edge 243a. Also, the first edge 243a is not adjacent to the second edge 243b. In this embodiment, the first edge 243a along the first direction 270 can be designed differently from that of the second edge 243b along the second direction 272 in the plan view. Also, a first length L1 of the metal pad 243 along the first direction 270 can be designed differently from a second length L2 of the metal pad 243 along the second direction 272 in the plan view as shown in FIG. 3. In this embodiment, a ratio of the first length L1 to the second length L2 can be designed between about 46:45 and 99:54. In one embodiment, an angle a between the first direction 270 and the second direction 272 may be designed larger than 0 degrees and less than or equal to 90 degrees.

In another embodiment of a semiconductor package which the metal pad 243 is an oval-shape or another 180-degree rotationally symmetrical shape, a first length L1 of the metal pad 243 along the first direction 270 can be designed differently from a second length L2 of the metal pad 243 along the second direction 272 in the plan view. Also, a ratio of the first length L1 to the second length L2 can be designed between about 46:45 and 99:54. Further, an angle a between the first direction 270 and the second direction 272 may be designed larger than 0 degrees and less than or equal to 90 degrees. For example, if the metal pad 243 is an oval-shape, the first direction 270 is also along a major axis of the metal pad 243, and the second direction 272 is also along a minor axis of the metal pad 243.

As shown in FIGS. 2 and 3, the opening 246a formed in the stress buffering layer 246 to expose at least a portion of the metal pad 243. In this embodiment as shown in FIG. 3, the opening 246a is an octangular shape in the plan view. Also, the opening 246a has a third length L3 along the first direction 270 and a fourth length L4 different from the third length L3 along the second direction 272 in the plan view. In another embodiment, the opening 246a may be an oval-shape or another 180-degree rotationally symmetrical shape, like the metal pad 243. Additionally, the conductive pillar bump 310 may be an octangular shape or oval shape in the plan view.

Figure 4A:
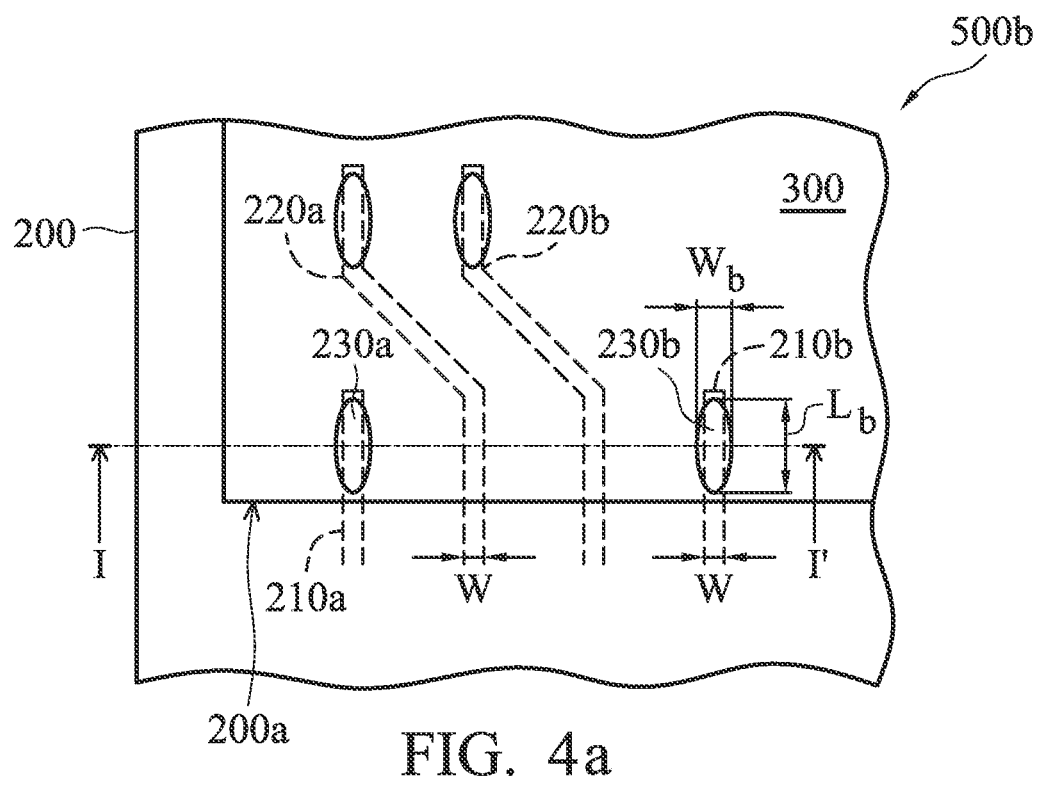
FIG. 4a is a plan view showing a portion of another exemplary embodiment of a semiconductor package of the invention.
Figure 4B:
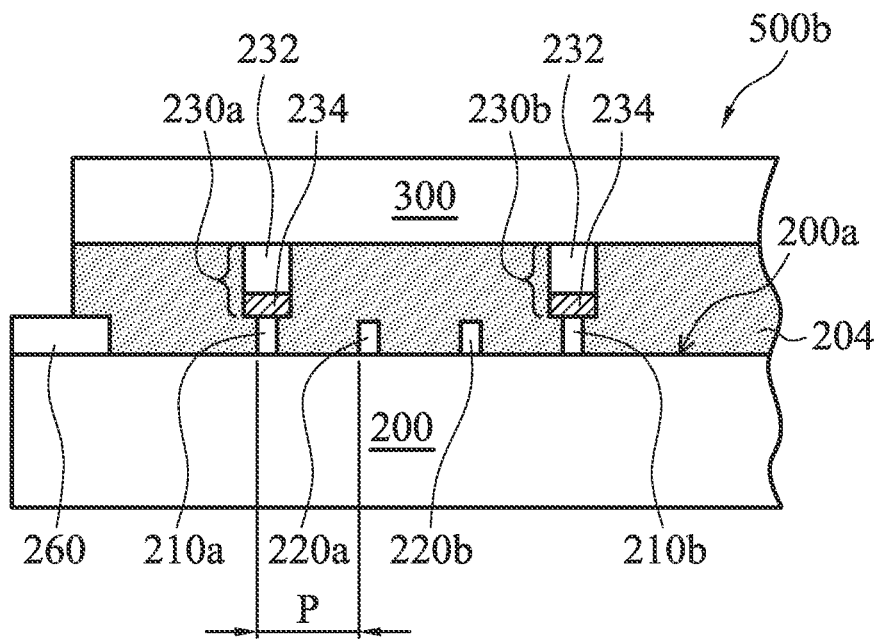
Figure 5A:
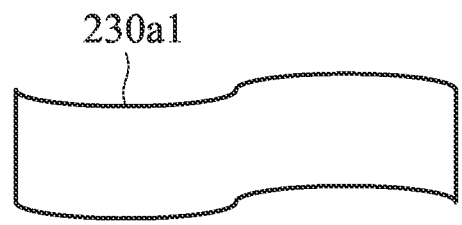
FIGS. 5a to 5f are plan views showing shapes of various embodiments of a conductive pillar bump of the invention.
Figure 5B:
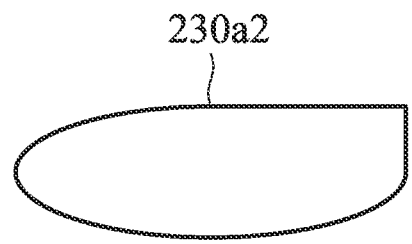
Figure 5C:
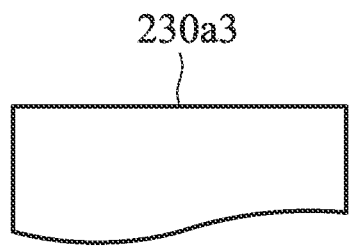
Figure 5D:
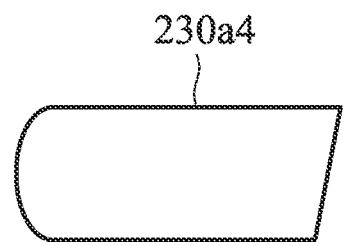
Figure 5E:
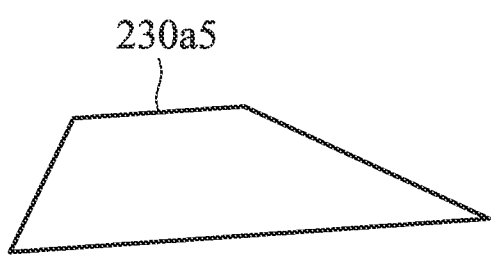
Figure 5F:
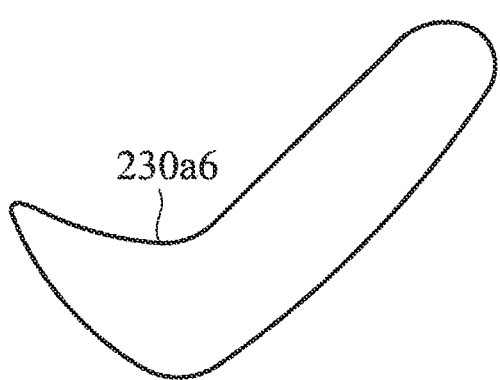

Alternatively, a width or length ratio of the conductive pillar bump to the conductive trace can be designed for further improvement of routing ability for high-density semiconductor packages. FIG. 4a is a plan view showing a portion of another exemplary embodiment of a semiconductor package 500b of the invention. FIG. 4b is a partial sectional view taken along line I-I' in FIG. 4a. In this embodiment, the semiconductor package 500b is a flip chip package using conductive pillar bumps, for example, copper pillar bumps, connecting a semiconductor die and a substrate. Elements of the embodiments that are the same or similar as those previously described with reference to FIGS. 1-3, are hereinafter not repeated for brevity.

In this embodiment, as shown in FIGS. 4a and 4b, at least one of the conductive pillar bumps 230a and 230b, when viewed from above, may have a rounded and slightly elongated outline extending along the conductive traces 210a and 210b. In this embodiment, the bump width Wb of at least one of the conductive pillar bumps, for example, the conductive pillar bump 230b, is substantially from equal to or larger than a line width W of the conductive trace, such as the conductive trace 210b on the die attach surface 200a of the substrate 200 to two-and-a-half times smaller than the line width W of the conductive trace, such as the conductive trace 210b on the die attach surface 200a of the substrate 200. In one embodiment, the bump length Lb of at least one of the conductive pillar bumps, for example, the conductive pillar bump 230b, may be from two times smaller than the line width of the trace to three times greater than the line width W of the conductive trace, such as the conductive trace 210b on the die attach surface 200a of the substrate 200. Also, the die 300 may have a bump pitch P between 50 μm and 200 μm.

Additionally, at least one of a plurality of conductive pillar bumps may be designed as arbitrary shapes except an oval shape to broaden design choices. For example, at least one of the plurality of conductive pillar bumps may be a non-round or asymmetric shape from the plan view. FIGS. 5a to 5f are plan views showing shapes of various embodiments of a conductive pillar bump. As shown in FIGS. 5a to 5f, the conductive pillar bumps 230a1-230a6 are exemplary embodiments of non-round or asymmetric shaped conductive pillar bumps, it is to be understood that the invention is not limited to the disclosed embodiments.

Figure 6A:
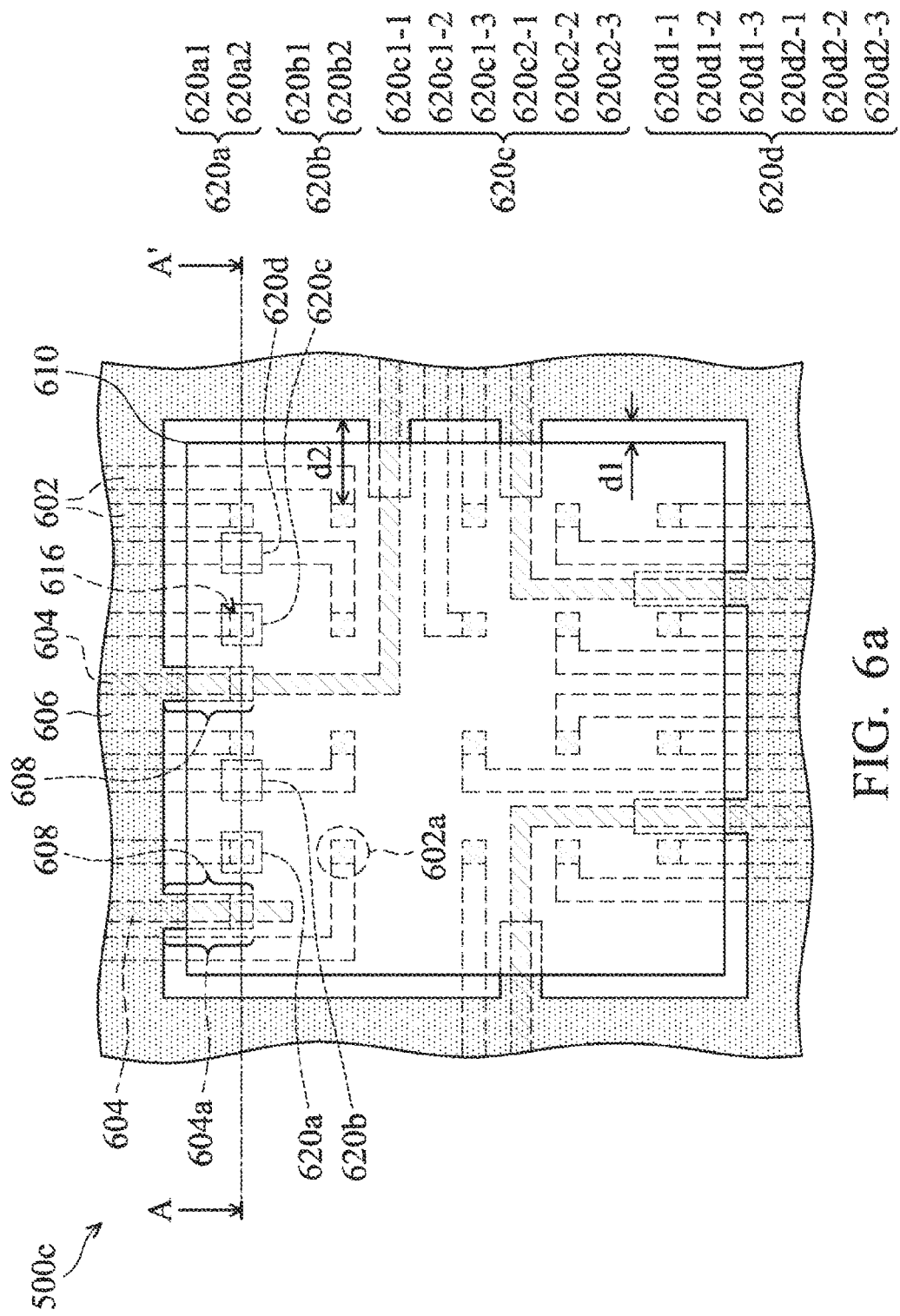
FIG. 6a shows a top view of yet another exemplary embodiment of a semiconductor package of the invention.
Figure 6B:
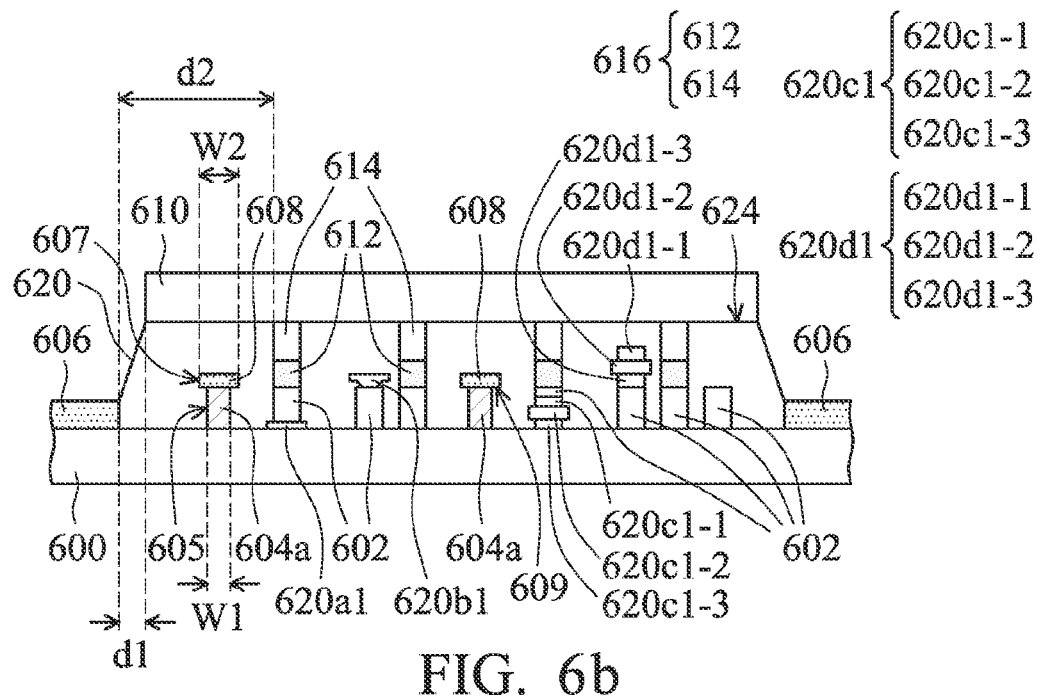
Figure 6C:
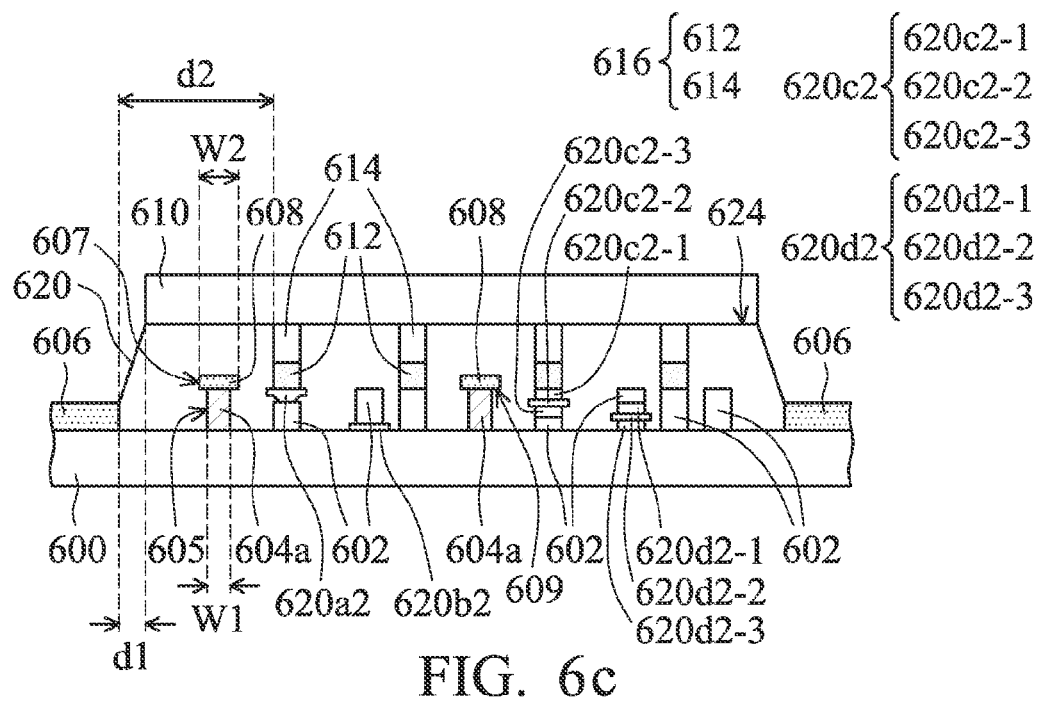

FIG. 6a shows a top view of yet another exemplary embodiment of a semiconductor package 500c of the invention. FIG. 6b shows one possible cross section along line A-A' of FIG. 6a. FIG. 6c shows another possible cross section along line A-A' of FIG. 6a. Yet another exemplary embodiment of a semiconductor package 500c is a flip chip package using conductive pillar bumps, for example, copper pillar bumps, connecting a semiconductor die and a substrate. As shown in FIGS. 6a to 6c, yet another exemplary embodiment of a semiconductor package 500c comprises a substrate 600 with first conductive traces 602 and second conductive traces 604 disposed thereon. In one embodiment, the substrate 600 may be formed of semiconductor materials such as silicon, or organic materials such as bismaleimide triazine, (BT), polyimide or Ajinomoto build-up film (ABF). In one embodiment, the first conductive trace 602 and the second conductive trace 604 may comprise signal traces or ground traces, which are used for input/output (I/O) connections of a semiconductor die 610 mounted directly onto the substrate 600. In this embodiment each of the first conductive traces 602 has a portion 602a as a pad region of the substrate 600, and each of the second conductive traces 604 serves as a signal/ground trace segment for routing.

Still referring to FIGS. 6a to 6c, a solder resistance layer 606 is formed covering the substrate 600. Also, the solder resistance layer 606, except for extending portions 608, exposes an overlapping region between a subsequently mounted semiconductor die 610 and the substrate 600. It is noted that the extending portions 608 of the solder resistance layer 606 extends along the second conductive trace 604 and covers a portion of the second conductive trace 604. Also, the solder resistance layer 606, except for extending portions 608, is disposed away from the subsequently mounted semiconductor die 610 by a distance d1. In one embodiment, the solder resistance layer 606 may comprise solder mask materials, oxide, nitride, or oxynitride. As shown in FIG. 6b, the extending portions 608 of the solder resistance layer 606 covers a portion 604a of the second conductive trace 604. It is noted that a width W2 of the extending portion 608 of the solder resistance layer 606 is designed to be larger than a width W1 of the portion 604a of the second conductive trace 604, so that a portion of a bottom surface 609 of the extending portion 608 of the solder resistance layer 606 is exposed from the portion 604a of the second conductive trace 604, and the extending portion 608 of the solder resistance layer 606 has a vertical sidewall 607 extruding over to an adjacent vertical sidewall 605 of the portion 604a of the second conductive trace 604. Therefore, the extending portion 608 and the portion 604a of the first conductive trace 204 collectively have a T-shaped cross section.

Still referring to FIGS. 6a to 6c, conductive pillar bumps 616 are then formed over the portions (pad regions) 602a of the first conductive traces 602. In this embodiment, each of the conductive pillar bumps 616 is composed by a metal stack comprising a UBM (under bump metallurgy) layer (not explicitly shown), a copper layer 614, and a solder cap 612. Alternatively, conductive buffer layers (not shown) formed of Ni may be formed between the conductive pillar bumps 616 and the portions (pad regions) 602a of the first conductive traces 602, and the conductive buffer layers may serve as seed layers, adhesion layers and barrier layers for the conductive pillar bumps 616 formed thereon. In one embodiment, the conductive pillar bumps 616 are used as a solder joint for a subsequently formed conductive bump or bond pad, which transmits input/output (I/O), ground or power signals of the semiconductor die 610 formed thereon. Therefore, the conductive pillar bumps 616 may help to increase the mechanical strength of the bump structure.

Still referring to FIGS. 6a to 6c, the semiconductor die 610 has a plurality of conductive bumps or a bond pads (not shown) disposed on an active surface 624 thereof mounted on a die attach surface of the substrate 600. The metal pads of the semiconductor die 610 respectively connect to the portions (pad regions) 602a of the first conductive traces 602 through the conductive pillar bumps 616 therebetween. As shown in FIG. 6a, the solder resistance layer 606 is disposed away from the portions (pad regions) 602a of the first conductive traces 602, which overlap with the conductive pillar bumps 616, by at least a distance d2. Also, the extending portion 608 of the solder resistance layer 606 is below the semiconductor die 610, over the active surface 624 of the semiconductor die 610 and within a projection area (not shown) of the semiconductor die 610.

Still referring to FIGS. 6a to 6c, an underfill material 620 may fill a gap between the substrate 600 and the semiconductor die 610 and cover the solder resistance layer 606 to compensate for differing coefficients of thermal expansion (CTE) between the substrate, the conductive traces and the semiconductor die. In this embodiment, the portion of the bottom surface 609 of the extending portion 608 of the solder resistance layer 606 is wrapped by the underfill material 620.

The underfill material wraps the portion of the bottom surface of the extending portion of the solder resistance layer, which has a wider width than the portion of the first conductive trace, so that the underfill material may be anchored with a T-shaped feature formed by both the extending portion of the solder resistance layer and the portion of the first conductive trace. Thus, the conventional underfill delamination problem occurring between the conductive trace and the underfill material is improved. Also, the extending portion of the solder resistance layer only extends into a projection area of the die to cover a portion of the first conductive trace, and the remaining portion of the solder resistance layer is disposed away from the semiconductor die by a distance, so that the semiconductor package still has enough space to allow the underfill material to flow to fill the gap between the substrate and the semiconductor die. Therefore, the extending portion of the solder resistance layer does not affect the performance of the dispensing process. Moreover, exemplary embodiments of a semiconductor package can be used in many types of package methods. For example, a gap between the substrate and the semiconductor die can be filled with a molding compound only. Alternatively, the gap between the substrate and the semiconductor die can be filled with a molding compound and an underfill material. Further, the gap between the substrate and the semiconductor die can be filled with an underfill material only.

Additionally, an additional conductive structure may be added under or above the second conductive trace 602 comprising signal traces or ground traces to broaden design choices. A position of the additional conductive structure may be designed overlapping the conductive pillar bump or away from the conductive pillar bump. As shown in FIGS. 6a to 6c, a conductive structure 620a, 620b, 620c or 620d may be disposed between the second conductive trace 602 and the conductive pillar bump 616 or between the second conductive trace 602 and the substrate 600. In one embodiment as shown in FIGS. 6a and 6b, a conductive structure 620a1 or 620c1 is disposed between the second conductive trace 602 and the substrate 600. Also, the conductive structure 620a1 or 620c1 contacts the second conductive trace 602 and the substrate 600, overlapping with the conductive pillar bump 616. Further, a conductive structure 620b1 or 620d1 is disposed overlapping a portion of the second conductive trace 602 and the semiconductor die 610, wherein the portion of the second conductive trace 602 is away from the conductive pillar bump 616. In another embodiment as shown in FIGS. 6a and 6c, a conductive structure 620a2 or 620c2 is disposed between the second conductive trace 602 and the conductive pillar bump 616. Also, the conductive structure 620a2 or 620c2 contacts the second conductive trace 602 and the conductive pillar bump 616, overlapping with the conductive pillar bump 616. Further, a conductive structure 620b2 or 620d2 is disposed overlapping a portion of the second conductive trace 602 and the substrate 600, wherein the portion of the second conductive trace 602 is away from the conductive pillar bump 616.

In one embodiment, the conductive structure 620*a*, 620*b*, 620*c* or 620*d* may be used for transmitting signals. In one embodiment, the conductive structure 620*a*, 620*b*, 620*c* or 620*d* may comprise a single-layer structure. In this embodiment, the conductive structures 620*a* and 620*b* are single-layer structures, and the conductive structures 620*c* and 620*d* are multi-layer structures. In one embodiment, the single-layer structure may comprise a conductive trace or a metal pad. In one embodiment, the multi-layer structure is a stack of conductive traces, metal pads or combinations thereof. In one embodiment as shown in FIGS. 6*b* and 6*c*, the conductive structures 620*c*1/620*c*2 disposed between the second conductive trace 602 and the substrate 600 may comprise conductive structure portions 620*c*1-1/620*c*2-1, 620*c*1-2/620*c*2-2 and 620*c*1-3/620*c*2-3, from top to bottom. Each of the conductive structure portions 620*c*1-1/620*c*2-1, 620*c*1-2/620*c*2-2 and 620*c*1-3/620*c*2-3 may comprise a conductive trace or a metal pad. For example, the conductive structure portions 620*c*1-1/620*c*2-1, 620*c*1-2/620*c*2-2 and 620*c*1-3/620*c*2-3 may be a conductive trace, a metal pad and another conductive trace, respectively. Therefore, the conductive structure portions 620*c*1-1/620*c*2-1, 620*c*1-2/620*c*2-2 and 620*c*1-3/620*c*2-3 may collectively compose a stack of conductive traces, metal pads or combinations thereof. However, it should be noted that there is no limitation on the number of the conductive structure portions.

Similarly, in one embodiment as shown in FIGS. 6*b* and 6*c*, the conductive structure 620*d*1/620*d*2 disposed overlapping a portion of the second conductive trace 602 and the semiconductor die 610 may comprise conductive structure portions 620*d*1-1/620*d*2-1, 620*d*1-2/620*d*2-2 and 620*d*1-3/620*d*2-3, from top to bottom. Each of the conductive structure portions 620*d*1-1/620*d*2-1, 620*d*1-2/620*d*2-2 and 620*d*1-3/620*d*2-3 may comprise a conductive trace or a metal pad. For example, the conductive structure portions 620*d*1-1/620*d*2-1, 620*d*1-2/620*d*2-2 and 620*d*1-3/620*d*2-3 may be a conductive trace, a metal pad and another conductive trace, respectively. Therefore, the conductive structure portions 620*d*1-1/620*d*2-1, 620*d*1-2/620*d*2-2 and 620*d*1-3/620*d*2-3 may collectively compose a stack of conductive traces, conductive pads or combinations thereof. However, it should be noted that there is no limitation on the number of the conductive structure portions.

Figure 6D:
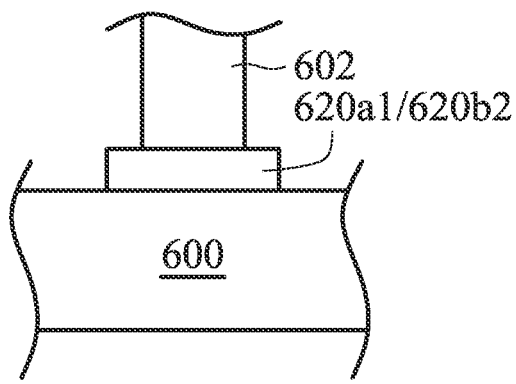
FIGS. 6d, 6e and 6f are enlarged views of portions of FIGS. 6b and 6c, showing detailed arrangements of the conductive structures.
Figure 6E:
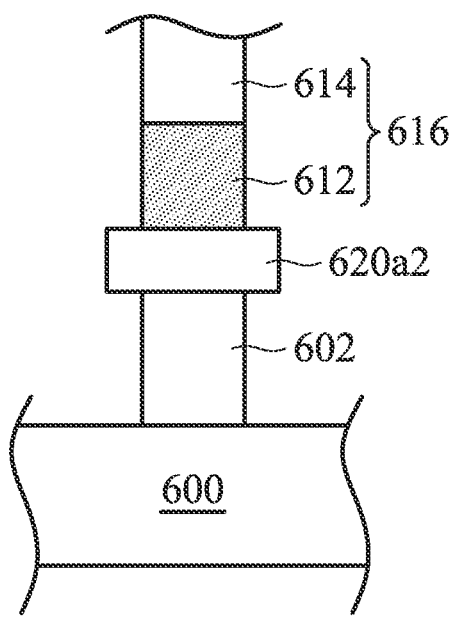
Figure 6F:
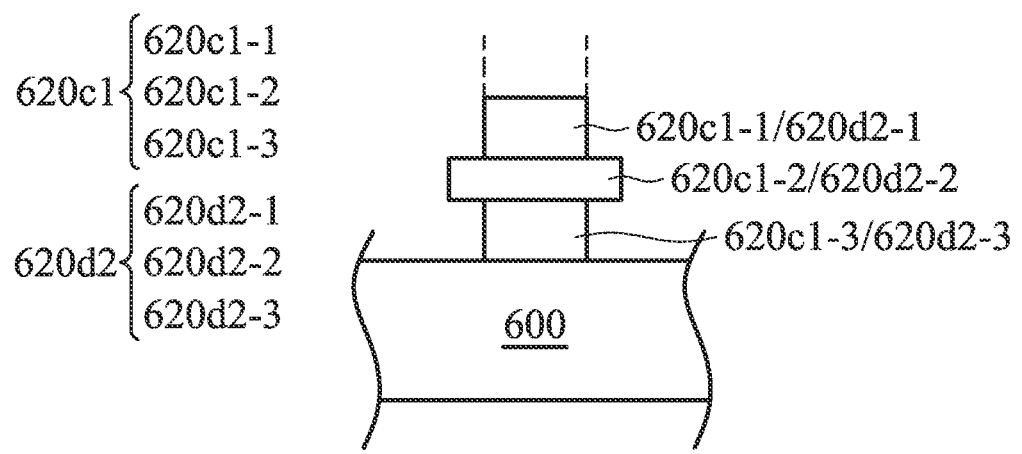

FIGS. 6*d*, 6*e* and 6*f* are enlarged views of portions of FIGS. 6*b* and 6*c*, showing detailed arrangements of one exemplary embodiment of the conductive structures 620*a*1, 620*a*2, 620*b*2, 620*c*1 and 620*d*2. FIG. 6*d* illustrates a detailed arrangement of the conductive structure 620*a*1 or 620*b*2 as shown in FIGS. 6*b* and 6*c*. In this embodiment, the conductive structure 620*a*1/620*b*2, which serves as a metal pad 620*a*1/620*b*2, is directly disposed on the substrate 600 and the second conductive trace 602 is disposed on top of the metal pad 620*a*1/620*b*2.

FIG. 6*e* illustrates a detailed arrangement of one exemplary embodiment of the conductive structure 620*a*2 as shown in FIG. 6*c*. In this embodiment, the second conductive trace 602 is disposed on the substrate 600. Also, the conductive structure 620*a*2, which serves as a metal pad 620*a*2, is disposed on the second conductive trace 602. Further, the conductive pillar bump 616 is disposed on top of the metal pad 620*a*2.

FIG. 6*f* illustrates a detailed arrangement of one exemplary embodiment of the conductive structure 620*c*1 or 620*d*2 as shown in FIGS. 6*b* and 6*c*. In this embodiment, the conductive structure 620*c*1/620*d*2 is directly disposed on the substrate 600 and a conductive trace (e.g. the second conductive trace 602 as shown in FIGS. 6*b* and 6*c*) or a conductive pillar bump (e.g. the conductive pillar bump 616 as shown in FIGS. 6*b* and 6*c*) is disposed on top of the conductive structure 620*c*1/620*d*2. In this embodiment, the conductive structure 620*c*1/620*d*2 may comprise conductive structure portions 620*c*1-1/620*d*2-1, 620*c*1-2/620*d*2-2 and 620*c*1-3/620*d*2-3, from top to bottom. In this embodiment, the the conductive structure portions 620*c*1-1/620*d*2-1, 620*c*1-2/620*d*2-2 and 620*c*1-3/620*d*2-3 may serve a conductive trace 620*c*1-1/620*d*2-1, a metal pad 620*c*1-2/620*d*2-2 and another conductive trace 620*c*1-3/620*d*2-3, respectively. FIG. 6*f* shows the metal pad 620*c*1-2/620*d*2-2 is sandwiched by a multi-layer trace structure composed by the conductive trace 620*c*1-1/620*d*2-1 and the conductive trace 620*c*1-3/620*d*2-3. In one embodiment, the metal pad 620*c*1-2/620*d*2-2 may be replaced by a more conductive metal pad.

Figure 7A:
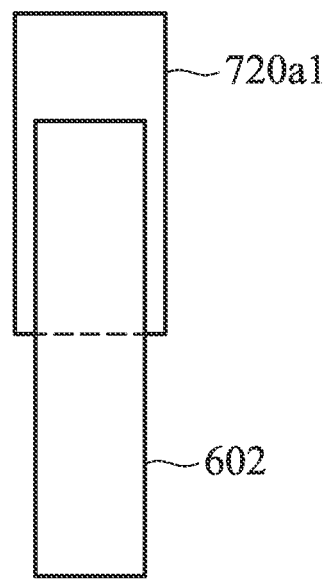
FIGS. 7a to 7f are plan views showing shapes of various embodiments of an additional metal pad of the invention.
Figure 7B:
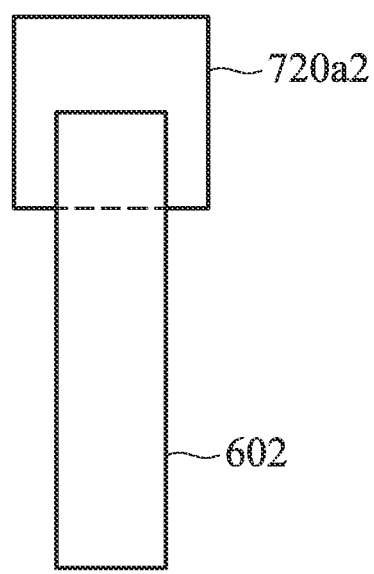
Figure 7C:
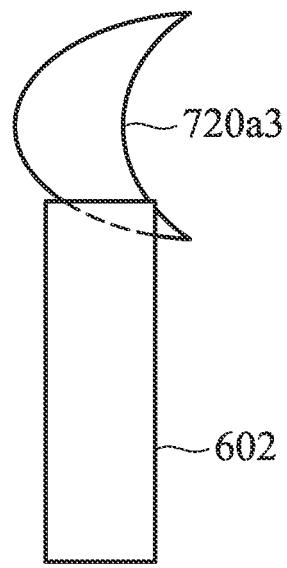
Figure 7D:
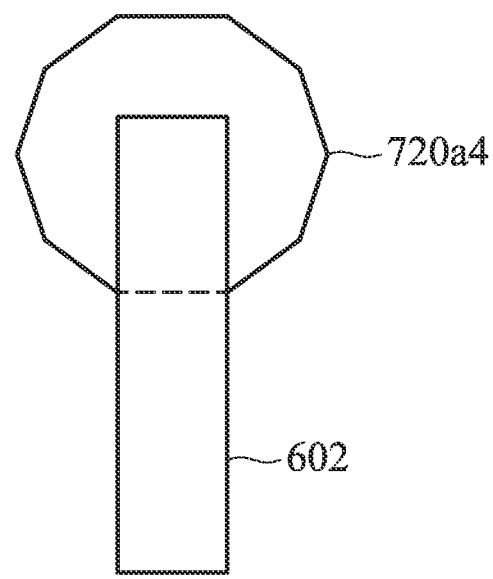
Figure 7E:
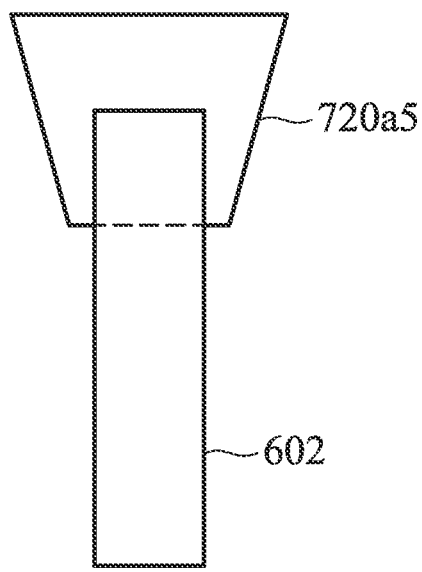
Figure 7F:
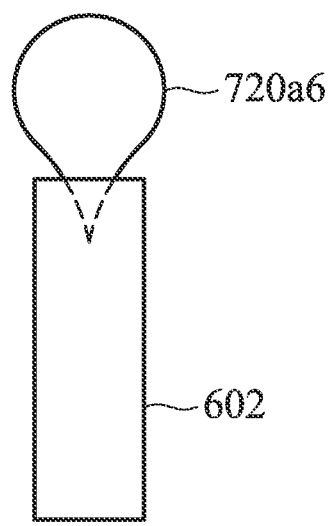

The additional conductive structure added under or above the second conductive trace 602 may have various shapes in the plan view for design choices. FIGS. 7*a* to 7*f* are plan views showing shapes of various embodiments of an additional conductive structure of the invention. As shown in FIGS. 7*a* to 7*f*, the conductive structures 720*a*1-720*a*6 are exemplary embodiments of polygonal-shaped, rounded-shaped, or drop-shaped conductive structures. For example, the conductive structure 720*a*1 as shown in FIG. 7*a* is a rectangular shape, the conductive structure 720*a*2 as shown in FIG. 7*b* is a square shape, the conductive structure 720*a*3 as shown in FIG. 7*c* is a crescent shape, the conductive structure 720*a*4 as shown in FIG. 7*d* is a decagonal shape, the conductive structure 720*a*5 as shown in FIG. 7*e* is a trapezoidal shape, and the conductive structure 720*a*6 as shown in FIG. 7*e* is a drop-shape. It is to be understood that the invention is not limited to the disclosed embodiments.

Moreover, the conductive pillar bump disposed on the semiconductor die and the corresponding conductive traces disposed on the substrate may have various arrangements to broaden design choices. FIGS. 8*a* to 8*h* are top views of various exemplary embodiments of an arrangement between conductive pillar bumps 816 and the corresponding conductive traces 804*a*-804*h* of the invention. In this embodiment, the conductive traces 804*a*-804*h* may comprise signal traces or ground traces, which are used for input/output (I/O) connections of a semiconductor die (e.g. the semiconductor die 610 as shown in FIG. 6*a*) mounted directly onto the substrate (e.g. the substrate 600 as shown in FIG. 6*a*). In this embodiment, each of the conductive traces 804*a*-804*h* serves as a signal/ground trace segment for routing.

Figure 8A:
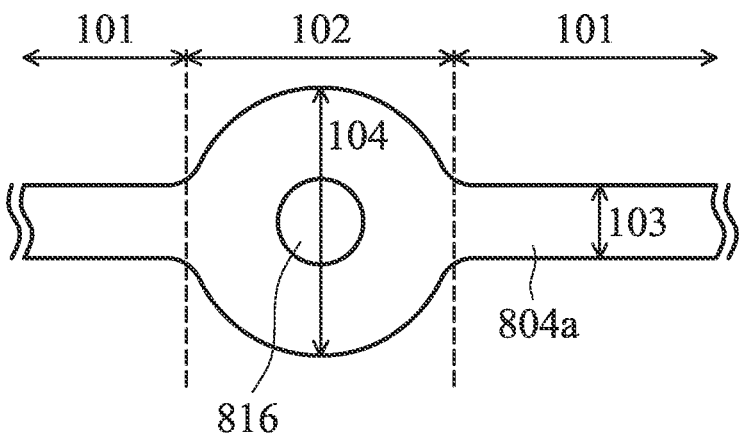
FIGS. 8a to 8h are top views of various exemplary embodiments of an arrangement between conductive pillar bumps and the corresponding conductive traces of the invention, wherein the conductive traces serve as signal/ground trace segments for routing.

As shown in FIG. 8*a*, the conductive trace 804*a* has at least a first portion 101 having a first width 103 and a second portion 102 having a second width 104. A conductive pillar bump 816 is disposed on the second portion 102 of the conductive trace. In this embodiment, the second width 104 of the second portion 102 is designed larger than the first width 103 of the first portion 101. Also, the second width 104 of the second portion 102 of the conductive trace 804*a* for the conductive pillar bump 816 bonded thereon is designed larger than a width of the conductive pillar bump 816. Further, profiles of opposite edges of the second portion 102 of the conductive trace 804*a* may be designed similar to a profile of the conductive pillar bump 816 in a top view. Therefore, the conductive pillar bump 816 is disposed within the second portion 102 of the conductive trace 804*a* in the top view.

Figure 8B:
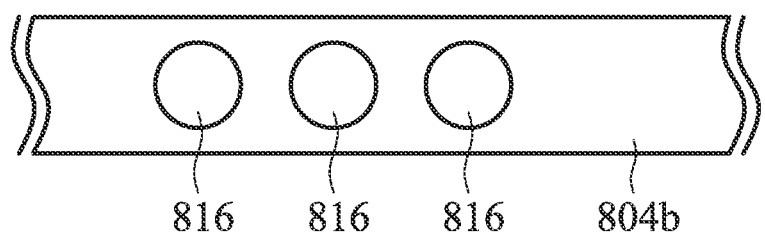

As shown in FIG. 8*b*, the conductive trace 804*b* has a uniform width, and a plurality of (such as three) conductive pillar bumps 816 are formed closely to each other. In this embodiment, the conductive pillar bumps 816 having a smaller width are collectively used to replace a single conductive pillar bump with a larger width. For example, a width of the conductive pillar bumps 816 as shown in FIG. 8b is designed smaller than a width of the conductive pillar bumps 816 as shown in FIG. 8a.

Figure 8C:
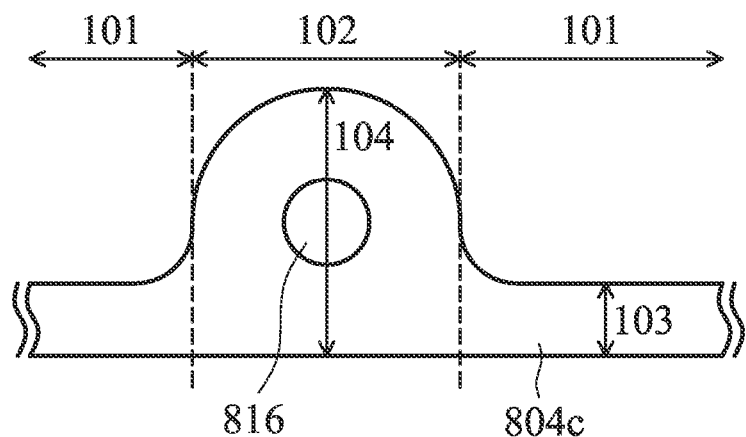

As shown in FIG. 8c, the conductive trace 804c has at least a first portion 101 having a first width 103 and a second portion 102 having a second width 104. A conductive pillar bump 816 is disposed on the second portion 102 of the conductive trace 804c. In this embodiment, the second width 104 of the second portion 102 is designed larger than the first width 103 of the first portion 101 of the conductive trace 804c. Also, the second width 104 of the second portion 102 of the conductive trace 804c for the conductive pillar bump 816 bonded thereon is designed larger than a width of the conductive pillar bump 816. In this embodiment, a profile of only one side of opposite edges of the second portion 102 of the conductive trace 804c is designed similar to a profile of the conductive pillar bump 816 in a top view. Therefore, the conductive pillar bump 816 is disposed within the second portion 102 of the conductive trace 804c in the top view.

Figure 8D:
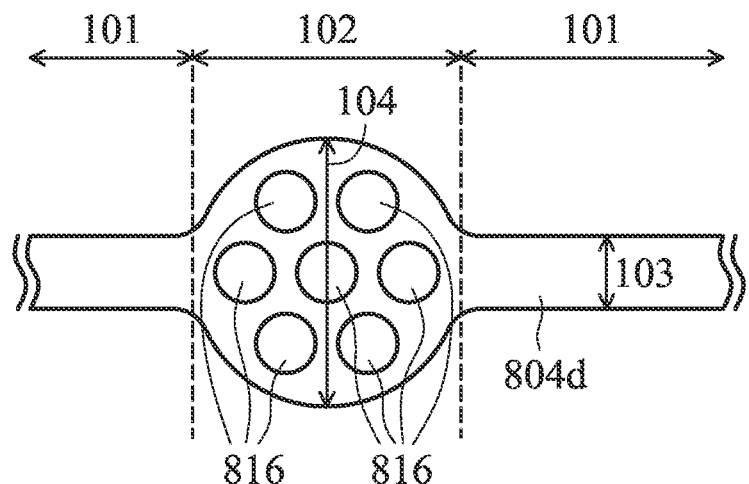

As shown in FIG. 8d, a second portion 102 of the conductive trace 804c has second width 104 much larger than a first width 103 of a first portion 101 of the conductive trace 804c to provide a plurality of conductive pillar bumps 816 disposed thereon. In this embodiment, edges of the second portion 102 of the conductive trace 804d may be designed surrounding all of the conductive pillar bumps 816 in a top view. Therefore, the conductive pillar bumps 816 are disposed within the second portion 102 of the conductive trace 804d in the top view.

Figure 8E:
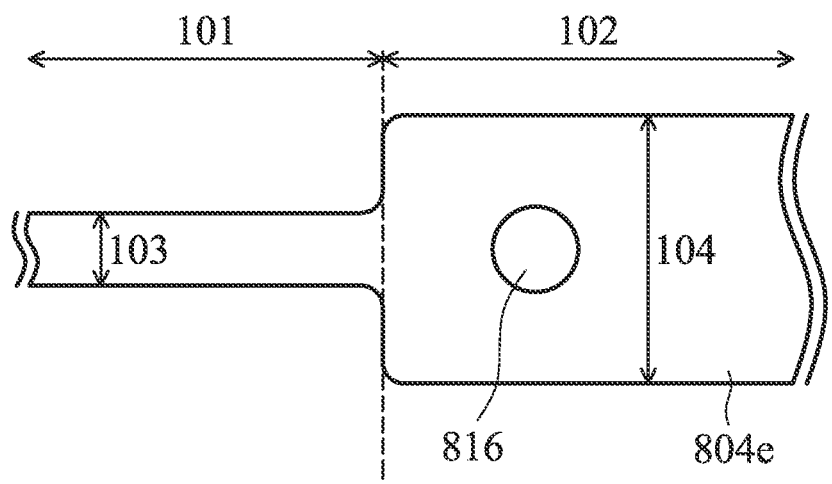

As shown in FIG. 8e, a second portion 102 of the conductive trace 804e has second width 104 much larger than a first width 103 of a first portion 101 of the conductive trace 804e to provide a conductive pillar bump 816 disposed thereon. In this embodiment, the second portion 102 of the conductive trace 804e may be design having a uniform width (the second width 104). Also, opposite edges of the second portion 102 of the conductive trace 804e may be parallel to each other in a top view.

Figure 8F:
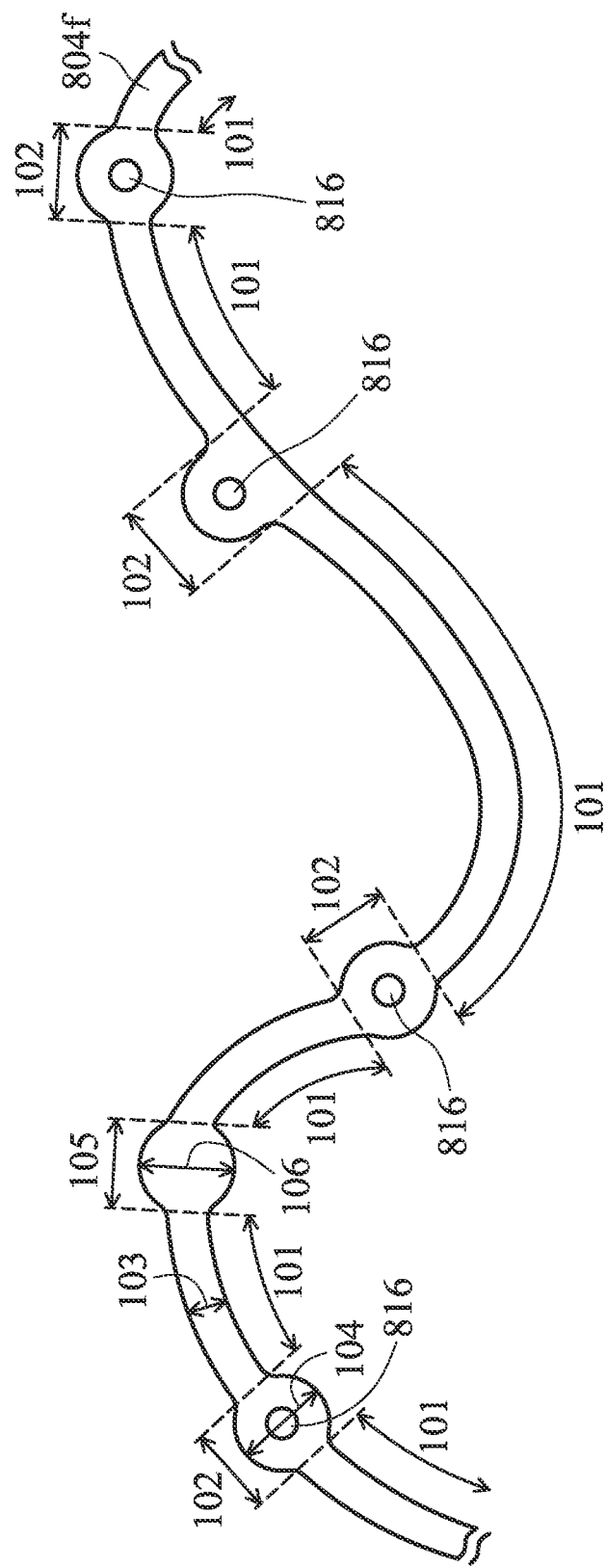

As shown in FIG. 8f, the conductive trace 804f has at least a first portion 101 having a first width 103, a least a second portion 102 having a second width 104 and a least a third portion 105 having a third width 106. In this embodiment, the single second portion 102 may be designed between two of the first portions 101 of the conductive trace 804f. Also, the single third portion 105 may be designed between two of the first portions 101 of the conductive trace 804f. In this embodiment, the second width 104 of the second portion 102 and the third width 106 of the third portion 105 are designed larger than the first width 103 of the first portion 101 of the conductive trace 804f. Also, the second width 104 of the second portion 102 and the third width 106 of the third portion 105 of the conductive trace 804f are designed larger than a width of the conductive pillar bump 816. It is noted that the second portion 102 of the conductive trace 804f is designed for the conductive pillar bump 816 bonded thereon. Also, the third portion 103 of the conductive trace 804f is formed but no conductive pillar bump is formed thereon. Further, the second portion 102 of the conductive trace 804f may be designed to have a profile similar to the second portion 102 of the conductive trace 804a or 804c as shown in FIG. 8a or 8c.

Figure 8G:
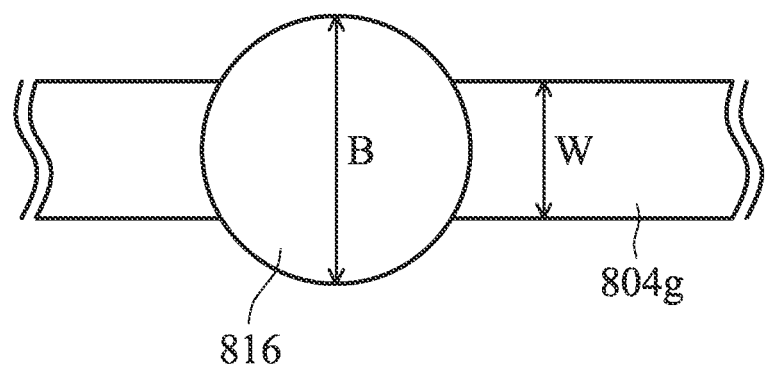
Figure 8H:
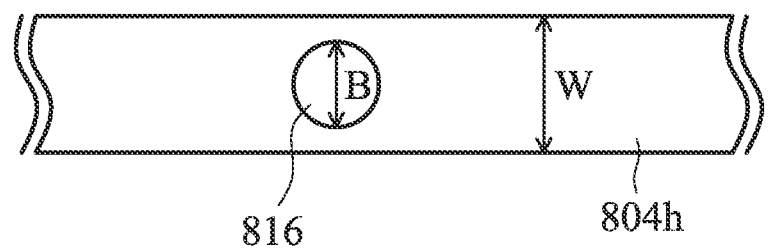

FIG. 8g and FIG. 8h illustrate the relationship between a bump width B of the conductive pillar bump 816 and a trace width W of the conductive trace 804g/804h. In one embodiment, the trace width W of the conductive trace 804g may be designed small than the bump width B of the conductive pillar bump 816. In another embodiment, the trace width W of the conductive trace 804h may be designed larger than the bump width B of the conductive pillar bump 816. In one embodiment, the relationship between a bump width B of the conductive pillar bump 816 and a trace width W of the conductive trace 804g/804h may be 10W<B<W/10.

FIGS. 9a to 9h are top views of various exemplary embodiments of an arrangement between conductive pillar bumps 816 and the corresponding conductive traces 804a-804h of the invention. In this embodiment, the conductive traces 902a-902h may comprise signal traces or ground traces, which are used for input/output (I/O) connections of a semiconductor die (e.g. the semiconductor die 610 as shown in FIG. 6a) mounted directly onto the substrate (e.g. the substrate 600 as shown in FIG. 6a). In this embodiment, each of the conductive traces 904a-904h has a portion as a pad portion of the substrate.

Figure 9A:
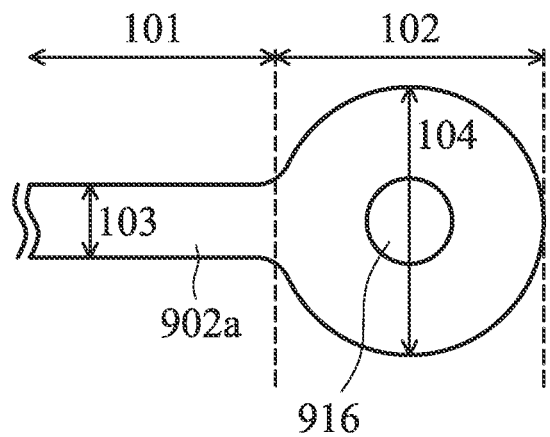
FIGS. 9a to 9h are top views of various exemplary embodiments of an arrangement between conductive pillar bumps and the corresponding conductive traces of the invention, wherein each of the conductive traces has a terminal portion serving as a pad portion.

As shown in FIG. 9a, the conductive trace 902a has a first portion 101 having a first width 103 and a second portion 102 having a second width 104. In this embodiment, the second portion 102 of the conductive trace 902a serving as a pad portion 102. A conductive pillar bump 916 is disposed on the second portion 102 of the conductive trace. In this embodiment, the second width 104 of the second portion 102 is designed larger than the first width 103 of the first portion 101 of the conductive trace 902a. Also, the second width 104 of the second portion 102 of the conductive trace 902a for the conductive pillar bump 916 bonded thereon is designed larger than a width of the conductive pillar bump 916. Further, a profile of the second portion 102 of the conductive trace 902a may be designed similar to a profile of the conductive pillar bump 916 in a top view. Therefore, the conductive pillar bump 816 is disposed within the second portion 102 of the conductive trace 902a in the top view.

Figure 9B:
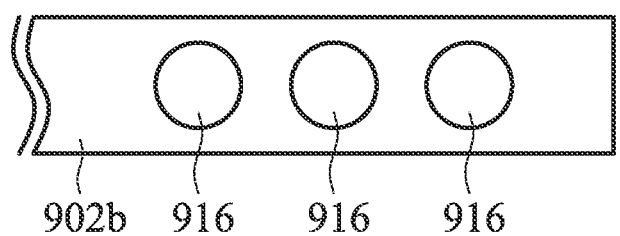

As shown in FIG. 9b, the conductive trace 902b has a uniform width, and a plurality of (such as three) conductive pillar bumps 916 are formed closely to each other. In this embodiment, the second portion 102 of the conductive trace 902b serving as a pad portion 102. In this embodiment, the conductive pillar bumps 916 having a smaller width are collectively used to replace a single conductive pillar bump with a larger width. For example, a width of the conductive pillar bumps 916 as shown in FIG. 9b is designed smaller than a width of the conductive pillar bumps 916 as shown in FIG. 9a.

Figure 9C:
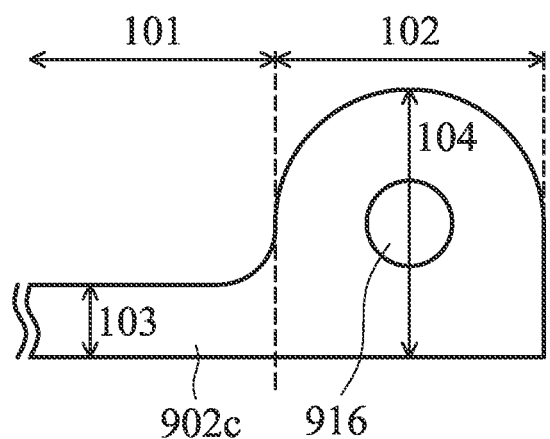

As shown in FIG. 9c, the conductive trace 902c has a first portion 101 having a first width 103 and a second portion 102 having a second width 104. In this embodiment, the second portion 102 of the conductive trace 902c serving as a pad portion 102. A conductive pillar bump 916 is disposed on the second portion 102 of the conductive trace 902c. In this embodiment, the second width 104 of the second portion 102 is designed larger than the first width 103 of the first portion 101 of the conductive trace 902c. Also, the second width 104 of the second portion 102 of the conductive trace 902c for the conductive pillar bump 916 bonded thereon is designed larger than a width of the conductive pillar bump 916. In this embodiment, a profile of only one side of opposite edges of the second portion 102 of the conductive trace 902c is designed similar to a profile of the conductive pillar bump 916 in a top view. Therefore, the conductive pillar bump 916 is disposed within the second portion 102 of the conductive trace 902c in the top view.

Figure 9D:
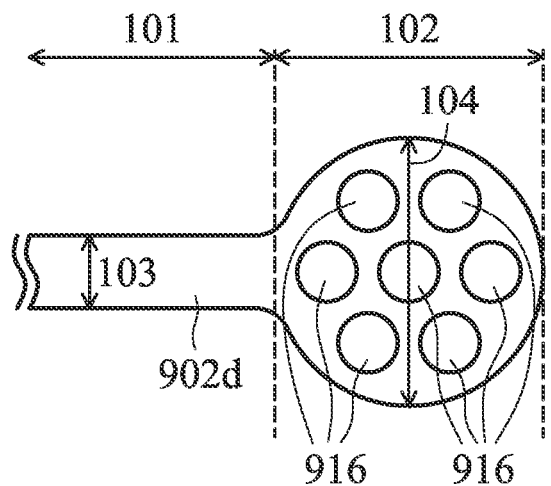

As shown in FIG. 9d, a second portion 102 of the conductive trace 902c has second width 104 much larger than a first width 103 of a first portion 101 of the conductive trace 902c to provide a plurality of conductive pillar bumps 916 disposed thereon. In this embodiment, the second portion 102 of the conductive trace 902d serving as a pad portion 102. In this embodiment, edges of the second portion 102 of the conductive trace 902d may be designed surrounding all of the conductive pillar bumps 916 in a top view. Therefore, the conductive pillar bumps 916 are disposed within the second portion 102 of the conductive trace 902d in the top view.

Figure 9E:
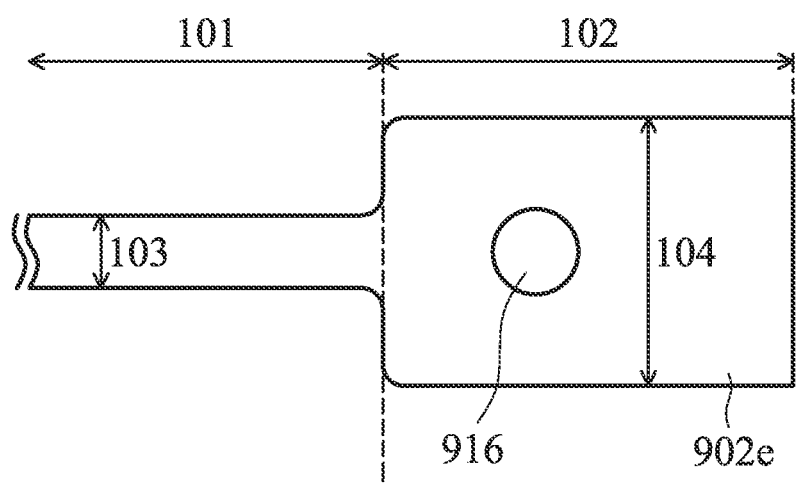

As shown in FIG. 9e, a second portion 102 of the conductive trace 902e has second width 104 much larger than a first width 103 of a first portion 101 of the conductive trace 902e to provide a conductive pillar bump 916 disposed thereon. In this embodiment, the second portion 102 of the conductive trace 902e serving as a pad portion 102. In this embodiment, the second portion 102 of the conductive trace 902e may be design having a uniform width (the second width 104). Also, opposite edges of the second portion 102 of the conductive trace 902e may be parallel to each other in a top view.

Figure 9F:
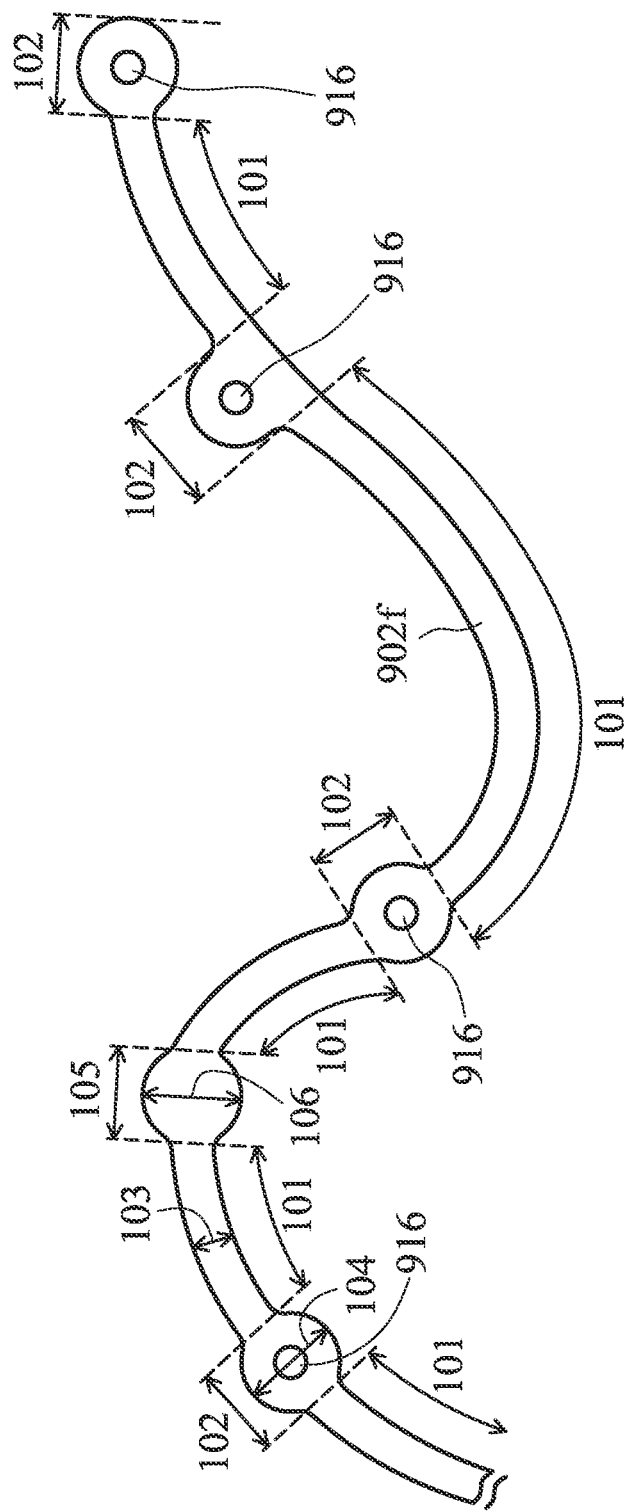

As shown in FIG. 9f, the conductive trace 902f has at least a first portion 101 having a first width 103, a least a second portion 102 having a second width 104 and a least a third portion 105 having a third width 106. In this embodiment, the right-most second portion 102 of the conductive trace 902f serving as a pad portion 102. In this embodiment, the single second portion 102 may be designed between two of the first portions 101 of the conductive trace 902f. Also, the single third portion 105 may be designed between two of the first portions 101 of the conductive trace 902f. In this embodiment, the second width 104 of the second portion 102 and the third width 106 of the third portion 105 are designed larger than the first width 103 of the first portion 101 of the conductive trace 902f. Also, the second width 104 of the second portion 102 and the third width 106 of the third portion 105 of the conductive trace 902f are designed larger than a width of the conductive pillar bump 816. It is noted that the second portion 102 of the conductive trace 902f is designed for the conductive pillar bump 916 bonded thereon. Also, the third portion 103 of the conductive trace 902f is formed but no conductive pillar bump is formed thereon. Further, the second portion 102 of the conductive trace 902f may be designed to have a profile similar to the second portion 102 of the conductive trace 902a or 902c as shown in FIG. 9a or 9c.

Figure 9G:
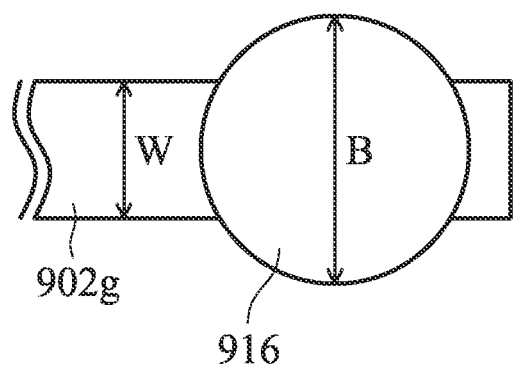
Figure 9H:
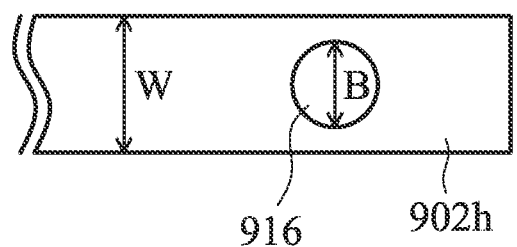

FIG. 9g and FIG. 9h illustrate the relationship between a bump width B of the conductive pillar bump 916 and a trace width W of the conductive trace 902g/902h. In this embodiment, the conductive trace 902g/902h has a terminal portion serving as a pad portion of the conductive trace 902g/902h. In one embodiment, the trace width W of the conductive trace 902g may be designed small than the bump width B of the conductive pillar bump 916. In another embodiment, the trace width W of the conductive trace 902h may be designed larger than the bump width B of the conductive pillar bump 916. In one embodiment, the relationship between a bump width B of the conductive pillar bump 916 and a trace width W of the conductive trace 902g/902h may be 10W<B<W/10.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a substrate;
   a conductive trace disposed on the substrate;
   a conductive pillar bump disposed on the conductive trace, wherein the conductive pillar bump is coupled to a die; and
   a solder resistance layer disposed on the substrate, wherein an extending portion of the solder resistance layer extends along the conductive trace into an overlapping region between the die and the substrate.

2. The semiconductor package as claimed in claim 1, wherein the conductive trace comprises a first portion having a first width and a second portion having a second width, and the conductive pillar bump is disposed on the second portion of the conductive trace.

3. The semiconductor package as claimed in claim 2, wherein the semiconductor package comprises a plurality of conductive pillar bumps disposed on the second portion of the conductive trace.

4. The semiconductor package as claimed in claim 1, wherein the semiconductor package further comprises a metal pad located between the conductive trace and the substrate.

5. The semiconductor package as claimed in claim 1, wherein the semiconductor package further comprises a metal pad located between the conductive pillar bump and the conductive trace.

6. The semiconductor package as claimed in claim 1, wherein the conductive trace comprises a plurality of conductive layers and a metal pad, wherein the metal pad is sandwiched by the plurality of conductive layers.

7. The semiconductor package as claimed in claim 1, wherein the extending portion of the solder resistance layer covers a portion of the conductive trace, and a width of the extending portion of the solder resistance layer is larger than that of the portion of the conductive trace.

8. The semiconductor package as claimed in claim 1, wherein the extending portion of the solder resistance layer covers a portion of the conductive trace, and the extending portion of the solder resistance layer and the portion of the conductive trace collectively have a T-shaped cross section.

9. The semiconductor package as claimed in claim 1, wherein the solder resistance layer further has a second extending portion, and the conductive pillar bump is positioned between the extending portion and the second extending portion.

10. The semiconductor package as claimed in claim 1, wherein the extending portion is separated from the substrate.

11. The semiconductor package as claimed in claim 1, further comprising
    an underfill material between the substrate and the die, wherein a portion of the underfill material is sandwiched by the extending portion and the die.

12. The semiconductor package as claimed in claim 1, further comprising
    an underfill material between the substrate and the die, wherein a portion of the underfill material is sandwiched by the extending portion and the substrate.

13. The semiconductor package as claimed in claim 1, further comprising
    an underfill material between the substrate and the die, wherein a portion of the underfill material is in direct contact with the substrate.

14. A semiconductor package, comprising:
a substrate;
a conductive trace disposed on the substrate;
a conductive pillar bump disposed on the conductive trace, wherein the conductive pillar bump is coupled to a die; and
a solder resistance layer, wherein a portion of the solder resistance layer and a portion of the conductive trace collectively have a T-shaped cross section, wherein the portion of the solder resistance layer forms a top, horizontal portion of the T-shape, and the portion of the first conductive trace forms a lower, vertical portion of the T-shape that contacts the top, horizontal portion at a substantial midpoint of the top horizontal portion.

15. The semiconductor package as claimed in claim 14, wherein a width of the portion of the solder resistance layer is larger than that of the portion of the conductive trace.

16. The semiconductor package as claimed in claim 14, wherein the portion of the solder resistance layer is separated from the substrate.

17. The semiconductor package as claimed in claim 14, further comprising
an underfill material between the substrate and the die, wherein a portion of the underfill material is in direct contact with the substrate.

18. The semiconductor package as claimed in claim 14, further comprising
an underfill material between the substrate and the die, wherein the portion of the solder resistance layer is embedded in the underfill material.

19. The semiconductor package as claimed in claim 14, wherein a bottom surface of the portion of the solder resistance layer faces the conductive trace, and a portion of the bottom surface is exposed from the portion of the conductive trace.

20. The semiconductor package as claimed in claim 19, further comprising
an underfill material between the substrate and the die, wherein the portion of the bottom surface is wrapped by the underfill material.

* * * * *